United States Patent [19]
Abe et al.

[11] 4,314,874
[45] Feb. 9, 1982

[54] METHOD FOR FORMING A FINE PATTERN OF AN ALUMINUM FILM

[75] Inventors: Haruhiko Abe; Yoji Mashiko, both of Itami; Hiroshi Harada, Kawanishi; Sotoju Asai; Kazuo Mizuguchi, both of Amagasaki; Sumio Nomoto, Itami, all of Japan

[73] Assignee: Mitsubishi Denki Kabushiki Kaisha, Tokyo, Japan

[21] Appl. No.: 190,286

[22] Filed: Sep. 24, 1980

[30] Foreign Application Priority Data

Oct. 9, 1979 [JP] Japan ................................ 54/130391

[51] Int. Cl.³ ............................................... C23F 1/02
[52] U.S. Cl. .................................... 156/628; 156/643; 156/646; 156/656; 156/659.1; 156/665; 204/192 E; 204/192 N; 427/38; 427/43.1
[58] Field of Search ............ 156/643, 646, 656, 659.1, 156/665, 628; 252/79.1; 204/164, 192 EC, 192 E, 298, 192 N; 148/187; 427/38, 42, 43.1, 88, 91

[56] References Cited

U.S. PATENT DOCUMENTS

| | | | |
|---|---|---|---|
| 3,436,327 | 4/1969 | Shockley | 204/192 E |
| 3,682,729 | 8/1972 | Gukelberger et al. | 156/628 X |
| 4,093,503 | 6/1978 | Harris et al. | 156/656 X |

FOREIGN PATENT DOCUMENTS 2723933  6/1978  Fed. Rep. of Germany ...... 156/643
49-32632 11/1974  Japan .

OTHER PUBLICATIONS

J. Vac. Sci. Technol., vol. 10, No. 6, Nov./Dec. 1973, Selective Area Metallization by Electron-Beam Controlled Direct Deposition by Ballantyne et al., pp. 1094-1097.

*Primary Examiner*—William A. Powell
*Attorney, Agent, or Firm*—Sughrue, Mion, Zinn, Macpeak and Seas

[57] ABSTRACT

A thin aluminum film 3 is formed on the top surface of a substrate 2, 1. Selected areas of the aluminum film are irradiated by an oxygen ion beam 6 to form implanted regions 7. The surface is then plasma etched, with the oxygen ion implanted regions serving as a mask to thereby prevent the removal of the underlying areas of the aluminum film.

6 Claims, 7 Drawing Figures

METHOD FOR FORMING A FINE PATTERN OF AN ALUMINUM FILM

BACKGROUND OF THE INVENTION

1. Field of the Invention

This invention relates to a method for forming an aluminum or aluminum alloy film in a fine pattern without using a photo resist.

2. Description of the Prior Art

In prior art techniques, an aluminum film has been commonly used for electrodes or leads of semiconductor devices such as Large Scale Integrated circuits (hereinafter called LSI).

FIG. 1 is a partial cross sectional view of an LSI which shows a prior method for forming aluminum film in a desired pattern. A silicon-dioxide film 2 is formed on a semiconductor substrate 1. An aluminum film 3 is disposed on the silicon-dioxide film by a vaporizing process.

In the first step, as shown in FIG. 1a, a photo resist film 4 is formed on the aluminum film 3 in the desired pattern by a photo deposition technique.

In the second step the aluminum film 3 is selectively removed in order to form the desired pattern, as shown in FIG. 1b. In this step, the photo resist film 4 protects the aluminum film 3 against etching.

This prior method requires many steps such as forming a photo resist film, selectively exposing the resist film to light, developing the lighted region, baking and removing the resist film.

Because the accuracy of a fine aluminum pattern depends upon the accuracy of the steps described above and on the contrast achieved during the development of the photo resist 4, this prior art method is limited in its accuracy. Moreover, a reduction in productivity is caused by the imperfect removal of the photo resist.

SUMMARY OF THE INVENTION

It is an object of this invention to provide an improved method for forming a fine pattern of an aluminum or aluminum alloy film without using a photo resist, thereby simplifying the production process. This object is accomplished by a method in which the aluminum or aluminum alloy film disposed on the surface of a substrate is selectively irradiated with an oxygen ion beam, and the film is plasma etched by using the ion implanted region as a mask.

DETAILED DESCRIPTION OF THE PREFERRED EMBODIMENT

Figure 1A:
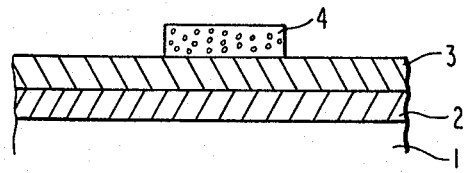
FIGS. 1(a) and 1(b) are sectional views of a semiconductor device showing the conventional etching process of an aluminum film.
Figure 1B:
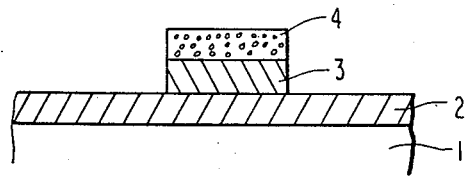
Figure 2:
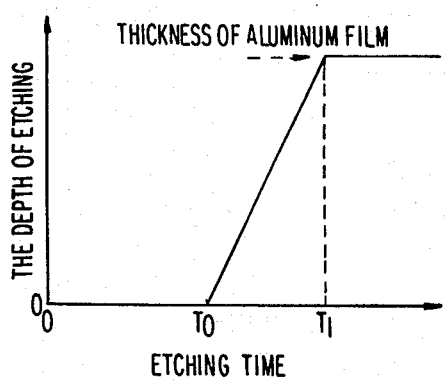
FIG. 2 is a characteristic diagram showing the relation between etched depth and etching time when the aluminum film is etched by a plasma etching technique.
Figure 3:
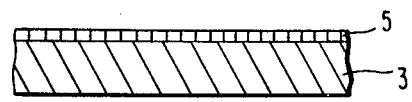
FIG. 3 is a sectional view of a semiconductor device showing the surface of the aluminum film covered with an alumina film.

The background concept underlying the present invention may be understood by referring to FIGS. 2 and 3.

FIG. 2 shows an etching depth vs. time plot when carbon tetrachloride ($CCl_4$) is used as the etching gas. As is clear from FIG. 2, although the etching process is started at time 0 (hereafter called the starting time), the actual etching of the aluminum film begins at Time $T_o$ (hereafter called the actual starting time). Accordingly, it has been experimentally determined by the inventors that the period from the starting time 0 to the actual starting time $T_o$ occupies a considerable part of the time of the overall etching process.

For example, in the case of an aluminum film of 1 $\mu$m thickness, 4 minutes elapse between time 0 and time $T_o$ when the aluminum film actually begins to be etched, and about 10 minutes elapse until time $T_1$ when the etching is finished (hereafter called the finishing time).

This etching start delay is caused by an alumina film 5 formed on the surface of the aluminum film 3 as shown in FIG. 3; the period from the starting time 0 to the actual starting time $T_o$ is needed to initially remove the alumina film 5. This alumina film is formed spontaneously by oxidization when the aluminum film 3 is exposed to the atmosphere. Although the thickness of the alumina film is generally less the 30 Å, it strongly retards the etching of the underlying aluminum film 3.

Figure 4A:
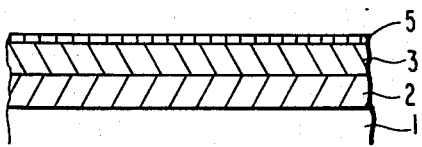
FIGS. 4(a), 4(b) and 4(c) are sequential sectional views showing the preferred embodiment of this invention.

Turning now to the present invention, FIG. 4(a) shows a silicon-dioxide film 2 formed on a silicon semiconductor substrate 1 and an aluminum film 3 disposed on the silicon-dioxide film 2. The surface of the aluminum film 3 is covered with an alumina film 5 having a thickness of less than 30 Å.

Figure 4B:
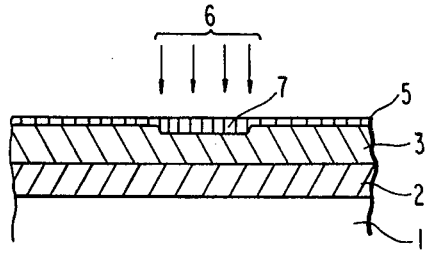

In the next step, as shown in FIG. 4(b), an oxygen ion implanted region is formed in the aluminum film 3 by irradiating the desired part of the aluminum film with an oxygen ion beam 6. The implanted oxygen reacts with the aluminum film 3 to convert it into an alumina film 5, and the thickness of the part of the alumina film which is irradiated by the oxygen ion beam therefore becomes greater than the rest of the alumina film, as shown by the implanted region 7 in FIG. 4(b).

Figure 4C:
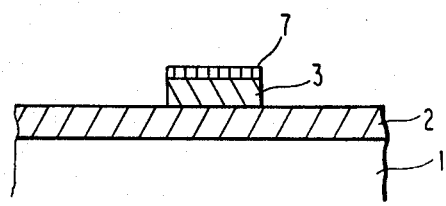

Subsequently, as shown in FIG. 4(c), the aluminum film 3 can be etched by means of plasma etching in a gas atmosphere such as carbon tetrachloride ($CCl_4$), using the thickened implanted region 7 of the alumina film as a mask. That is, since the alumina film is etched at a much slower rate than the underlying aluminum film, as shown in FIG. 2, the selectively thickened regions of the alumina film act as a mask, whereby the unthickened or unimplanted areas of alumina together with the underlying aluminum are completely etched away before the protective mask of thickened alumina is removed.

The thickness of the implanted region 7 is determined in relation to the thickness of the aluminum film 3 being etched. For example, if the aluminum film 3 is 1 $\mu$m in thickness, a thickness of about 100 Å for the implanted region 7 is sufficient.

According to the above method a masking film of thickened alumina is formed by an irradiating oxygen ion beam focused on the aluminum film 3 through a magnetic lens, whereby fine patterns can be easily formed without using a photo resist.

The masking alumina film 7 remaining, FIG. 4(c), can be easily removed with an etching liquid such as phosphoric acid or chromic acid at any time, for example after etching the aluminum film 3 or after making a contact hole through which an electrode is led out after a protecting film has been formed.

While the invention has been illustrated and described as an etching process for an aluminum film, it is to be understood that it is equally applicable to aluminum alloys such as aluminum-silicon alloy (Al-Si), aluminum-silicon-copper alloy (Al-Si-Cu), aluminum-copper alloy (Al-Cu), aluminum-manganese alloy (Al-Mn) and the like and is also applicable to other semiconductor devices such as discrete semiconductor devices or hybrid integrated circuits if they require a fine pattern of aluminum or aluminum alloy film.

Further, while the invention has been described with the aluminum film being etched by plasma in a carbon tetrachloride (CCl$_4$) gas atmosphere, it is to be understood that other etching gases such as bromine trichloride (BrCl$_3$) or trichloroethylene (C$_2$HCl$_3$) may be used. The required characteristics of the etching gas are the ability to etch an aluminum or an aluminum alloy film at a suitably high rate as compared with its ability to etch or penetration rate through an alumina film.

Furthermore, while the invention has been described with the thin alumina film being naturally formed by the reaction between the aluminum film and the atmospheric oxygen, it is to be understood that it is possible to keep the aluminum film coated substrate in a vacuum chamber where both selectively irradiating and plasma etching are performed to prevent the formation of the thin alumina film 5. The prevention of the formation of the thin alumina film make it possible to use thinner ion implanted regions 7, such as a thickness of around 50 Å, and serves to shorten the time required for the final plasma etching step.

What is claimed is:

1. A method for forming a fine pattern of an aluminum film, comprising the following steps:
    (a) coating a surface of a substrate with an aluminum film,
    (b) selectively irradiating said aluminum film with an oxygen ion beam to form an oxygen ion implanted region, and
    (c) plasma etching said aluminum film using said implanted region as a mask, whereby unimplanted areas of the aluminum film are removed while areas thereof underlying the implanted region are left substantially intact.

2. A method according to claim 1, wherein the aluminum film is approximately 1 $\mu$m thick, and the thickness of said implanted region is greater than 100 Å.

3. A method according to claims 1 or 2, wherein said aluminum film includes an aluminum alloy.

4. A method according to claims 1 or 2, wherein the plasma etching is performed with a gas selected from the group consisting of carbon tetrachloride, bromine trichloride or ethylene trichloride.

5. A method according to claim 1, further comprising exposing the aluminum film to the atmosphere before its selective irradiation to form a thin film of alumina thereon, whereafter the selective irradiation forms a thickened region of the alumina film.

6. A method according to claim 1, wherein both the selectively irradiating and plasma etching steps are performed in a vacuum chamber after the coating step.

* * * * *